United States Patent [19]

Terane et al.

[11] Patent Number: 5,311,142
[45] Date of Patent: May 10, 1994

[54] AMPLIFIER CIRCUIT WITH GAIN THAT DOES NOT VARY WITH POWER SUPPLY FLUCTUATIONS

[75] Inventors: Hideyuki Terane; Hiroyuki Sugino, both of Itami, Japan

[73] Assignee: Mitsubishi Denki Kabushiki Kaisha, Tokyo, Japan

[21] Appl. No.: 994,911

[22] Filed: Dec. 22, 1992

[30] Foreign Application Priority Data

Jan. 6, 1992 [JP] Japan .................. 4-000218

[51] Int. Cl.$^5$ .......................... H03F 3/38; H03K 7/02
[52] U.S. Cl. ........................ 330/10; 332/107
[58] Field of Search ............. 330/10, 207 A, 251, 330/284; 332/107, 159, 162, 168, 108, 109

[56] References Cited

U.S. PATENT DOCUMENTS 4,338,580  7/1982  Gay .......................... 332/107

OTHER PUBLICATIONS

Manual of Linear IC Practical Circuit, Y. Yokoi, Apr. 20, 1975, Chapter 14.3.3, pp. 372-376, "Switching AM Modulation Circuit".

*Primary Examiner*—Steven Mottola
*Attorney, Agent, or Firm*—Oblon, Spivak, McClelland, Maier & Neustadt

[57] ABSTRACT

There is disclosed an amplifier circuit providing a stable gain independently of fluctuations in power supply voltage, in which resistors (13, 14) and corrective switches (25, 26) having the same construction as analog switches (21 to 24) are provided in a feedback path from an output of an operational amplifier (1) to a negative input thereof, and in which resistors (15, 16) and corrective switches (27, 28) having the same construction as the analog switches (21 to 24) are provided in a reference voltage positive input path from a positive input of the operational amplifier (1) to a reference voltage (VR). An L level logical signal is applied to control inputs (C) of the corrective switches (25 to 28) and an H level logical signal is applied to control inputs (D) thereof. The corrective switches (25 to 28) are constantly set to an ON-state under the same conditions as the analog switches (21 to 24) in the ON-state.

9 Claims, 3 Drawing Sheets

AMPLIFIER CIRCUIT WITH GAIN THAT DOES NOT VARY WITH POWER SUPPLY FLUCTUATIONS

BACKGROUND OF THE INVENTION

1. Field of the Invention

The present invention relates to an amplifier circuit used as a balanced modulating circuit such as a ring modulating circuit.

2. DESCRIPTION OF THE BACKGROUND ART

FIG. 2 is a circuit diagram of a conventional differential amplifier circuit used as a ring modulating circuit which is a type of balanced modulating circuit. One end of a resistor 11 is connected to a negative input of an operational amplifier 1, and one end of a resistor 12 is connected to a positive input thereof. Resistors 13 and 14 connected in series are provided in a feedback path from the output of the operational amplifier I to the negative input thereof. Resistors 15 and 16 connected in series are provided in a reference voltage positive input path from the positive input of the operational amplifier 1 to a reference voltage VR. The resistors 11 to 16 have the same resistance.

An input signal SI to be modulated is applied to a signal input terminal 31, and a control signal SC is applied to a control signal input terminal 32. The output of the operational amplifier 1 is outputted from an output terminal 33 in the form of an output signal SO provided by the modulation of the input signal SI. An inverter 2 receives the control signal SC and inverts the logical level of the control signal SC to output an inverted control signal $\overline{SC}$.

Analog switches 21 to 24, shown in FIG. 2, are of the same internal construction, which is shown in FIG. 3. Referring to FIG. 3, each analog switch includes PMOS and NMOS transistors 41 and 42 which share first and second electrodes serving respectively as an input A and an output B. A signal given from a control input C is applied to the gate of the PMOS transistor 41, and a signal given from a control input D is applied to the gate of the NMOS transistor 42.

The input A of the analog switch 21 is connected to the signal input terminal 31, and the output B thereof is connected to the other end of the resistor 11. The reference voltage VR is applied to the input A of the analog switch 22, and the output B of the analog switch 22 is connected to the other end of the resistor 11. The input A of the analog switch 23 is connected to the signal input terminal 31, and the output B thereof is connected to the other end of the resistor 12. The reference voltage VR is applied to the input A of the analog switch 24, and the output B of the analog switch 24 is connected to the other end of the resistor 12.

The control signal SC is applied to the control inputs C of the analog switches 21 and 24 and to the control inputs D of the analog switches 22 and 23. The inverted control signal $\overline{SC}$ is applied to the control inputs C of the analog switches 22 and 23 and to the control inputs D of the analog switches 21 and 24.

The ring modulating circuit is a differential amplifier circuit having such construction that varies the logical level of the control signal SC at the frequency of a predetermined carrier wave in order, signal SO, the modulated signal provided by the balanced modulation of the input signal SI The amplification operation of the amplifier circuit will be described below. It is assumed that the reference voltage VR is 0 V. Reference character VI designates the voltage of the input signal SI; VO designates the voltage of the output signal SO; R designates the resistances of the resistors 11 to 16; and r designates the ON-resistances of the analog switches 21 to 24.

When the control signal SC is at the L level (or ground level), the analog switches 21 and 24 are on and the analog switches 22 and 23 are off. The input signal SI is applied to the negative input of the operational amplifier 1 through the resistor 11, and the reference voltage VR is applied to the positive input of the operational amplifier I through the resistor 12. As a result, the differential amplifier circuit functions as an inverting amplifier circuit, so that the output voltage VO is determined as:

$$VO = -\{2R/(R+r)\} \cdot VI \tag{1}$$

When the control signal SC is at the H level (or power supply voltage level), on the other hand, the analog switches 21 and 24 are off and the analog switches 22 and 23 are on. The input signal SI is applied to the positive input of the operational amplifier I through the resistor 2, and the reference voltage VR is applied to the negative input of the operational amplifier 1 through the resistor 11. As a result, the differential amplifier circuit functions as a noninverting amplifier circuit, so that the output voltage VO is determined as:

$$VO = \{2R/(R+r)\} \cdot VI \tag{2}$$

From Formulas (1) and (2), the gain G of the differential amplifier circuit is:

$$G = 2R/(R+r) \tag{3}$$

The gain G is determined by the resistances R of the resistors 11 to 16 and the resistances r of the analog switches 21 to 24.

The conventional differential amplifier circuit used as the ring modulating circuit is constructed as above described. One of the parameters to determine the gain of the differential amplifier circuit is the ON-resistances r of the analog switches 21 to 24.

The ON-resistances of the PMOS and NMOS transistors 41 and 42 constituting the analog switches 21 to 24 depend mainly on a gate voltage and are inversely proportional to the square of the power supply voltage, varying with fluctuations in power supply voltage.

Therefore, the conventional differential amplifier circuit has a problem in that the gain thereof varies with fluctuations in power supply voltage.

SUMMARY OF THE INVENTION

According to the present invention, an amplifier circuit includes a signal input terminal receiving an input signal, a control signal input terminal receiving a control signal, a reference voltage source for providing a reference voltage of a predetermined level, a signal output terminal, an operational amplifier having positive and negative inputs and an output connected to the signal output terminal. A resistor portion is connected to the negative input of the operational amplifier. A second resistor portion is connected to the positive input of the operational amplifier. A first switch is provided between the signal input terminal and the first resistor portion for turning itself on and off as a function of the control signal. A second switch is provided between the reference voltage source and the first resistor portion for turn itself on and off as a function of the control signal. A third switch is provided between the signal input terminal and the second resistor portion for turning itself on and off as a function of the control signal. A fourth switch is provided between the reference voltage source and the second resistor portion for turning Itself on and off as a function of the control signal. The first to fourth switches have the same internal construction, the control signal being applied to the first to fourth switches such that the ON/OFF state of the first and fourth switches is constantly opposite to that of the second third switches. A third resistor portion is provided in a feedback path from the output of the operational amplifier to the negative input thereof. The resistance ratio of the third resistor portion to the first resistor portion being N where N is a natural number. A first corrective switch portion, including corrective switches, is connected in the N-number in series and connected in series with the third resistor portion in the feedback path. The N-number of corrective switches have the same internal construction as the first to fourth switches and are constantly set to an ON-state under the same conditions as the first to fourth switches in the ON-state. A fourth resistor portion is provided in a reference voltage positive input path from the positive input of the operational amplifier to the reference voltage source. The resistance ratio of the fourth resistor portion to the second resistor portion is M, a natural number. A second corrective switch portion including corrective switches is connected in the M-number in series and connected in series with the fourth resistor portion in the reference voltage positive input path. The M-number of corrective switches have the same internal construction as the first to fourth switches and are constantly set to the ON-state under the same conditions as the first to fourth switches in the ON-state.

The first to fourth switches all have the same internal construction. The control signal is applied to the first to fourth switches such that the ON/OFF state of the first and fourth switches is constantly opposite to that of the second and third switches.

When the first and fourth switches are on, the second and third switches are off. The output voltage VO of the output signal of the amplifier circuit is:

$$VO = -\{N \cdot (R1 + r)/(R1 + r)\} \cdot VI$$
$$= -N \cdot VI$$

where VI is the voltage of the input signal, R1 is the resistance of the first resistor portion, R2 is the resistance of the second resistor portion, and r is the ON-resistances of the first to fourth switches and the corrective switches included in the first and second corrective switch portions.

When the first and fourth switches are off, on the other hand, the second and third switches are on. The output voltage VO of the output signal of the amplifier circuit is:

$$VO = \{(N + 1)(R1 + r)/(R1 + r)\} \cdot$$
$$\{M(R2 + r)/(M + 1)(R2 + r)\} \cdot VI$$
$$= (N + 1) \cdot M/(M + 1) \cdot VI$$

The provision of the first and second corrective switch portions, including the corrective switches of the same construction as the first to fourth switches in the feedback path and reference voltage positive input path, enables the gain of the amplifier circuit to be determined without being affected by the ON-resistances r of the first to fourth switches. Therefore, the gain of the amplifier circuit does not vary depending on fluctuations in power supply voltage.

An object of the present invention is to provide an amplifier circuit having a gain which does not vary with fluctuations in power supply voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
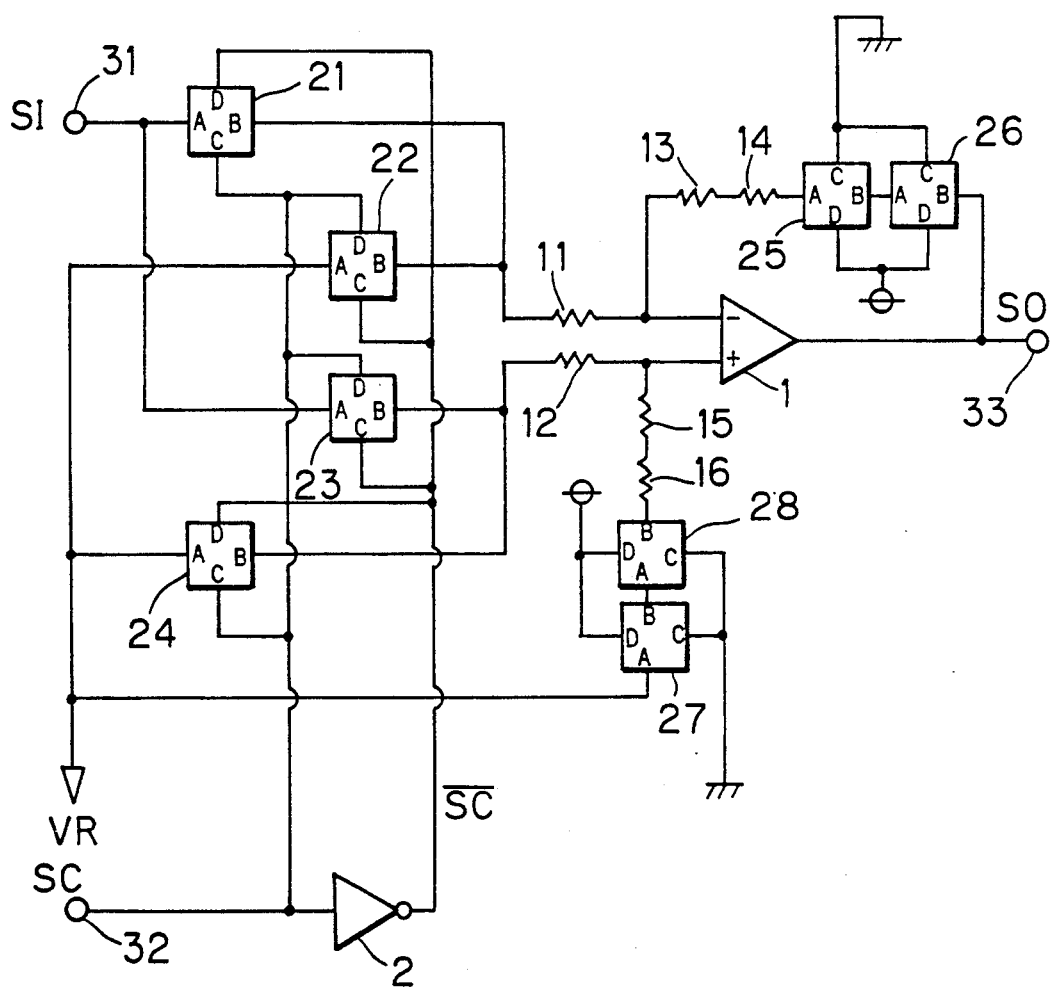
FIG. 1 is a circuit diagram of a differential amplifier circuit embodying the present invention.
Figure 2:
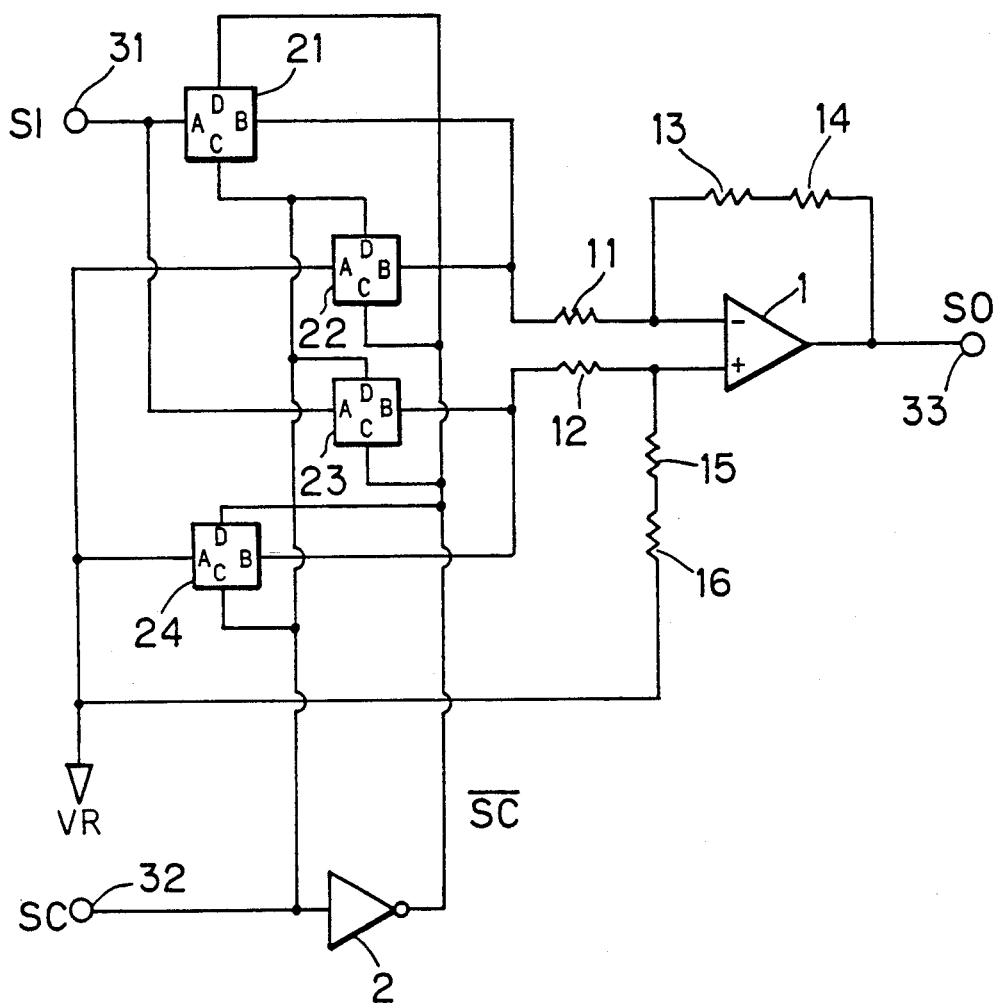
FIG. 2 is a circuit diagram of a conventional differential amplifier circuit.

FIG. 1 is a circuit diagram of a differential amplifier circuit used as a ring modulating circuit according to a preferred embodiment of the present invention.

One end of a resistor 11 is connected to a negative input of an operational amplifier 1, and one end of a resistor 12 is connected to a positive input thereof. Resistors 13 and 14 connected in series and corrective switches 25 and 26 connected in series are provided in a feedback path from the output of the operational amplifier I to the negative input thereof. Resistors 15 and 16, connected in series, and corrective switches 27 and 28, connected in series provided between the reference voltage positive input VR and the positive input of the operational amplifier 1 to a reference voltage VR. The resistors 11 to 16 have the same resistance.

Figure 3:
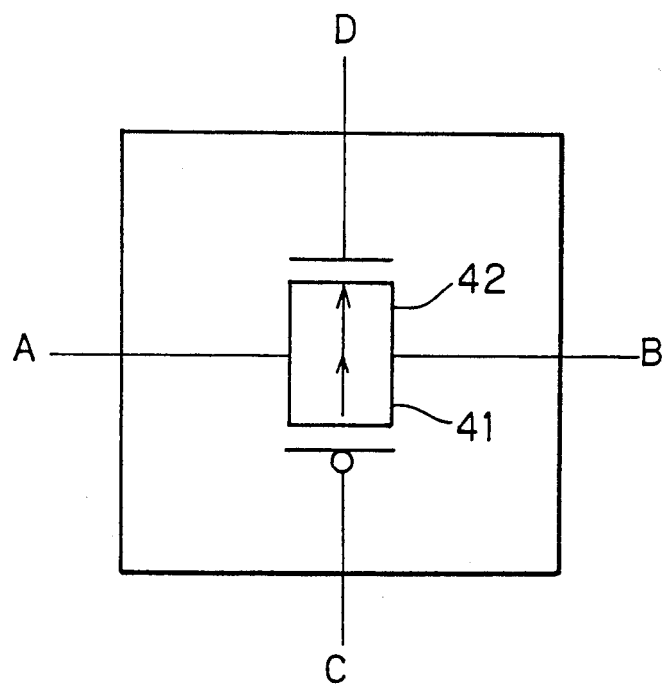
FIG. 3 is a circuit diagram showing the internal construction of an analog switch.

The corrective switches 25 to 28 have the same internal construction as analog switches 21 to 24. As shown in FIG. 3 in the prior art, each switch includes PMOS and NMOS transistors 41 and 42 which share first and second electrodes serving respectively as an input A and an output B. A signal given from a control input C is applied to the gate of the PMOS transistor 41, and a signal given from a control input D is applied to the gate of the NMOS transistor 42.

The input A of the corrective switch 25 is connected to one end of the resistor 14, and the output B thereof is connected to the input A of the corrective switch 26. The output B of the corrective switch 26 is connected to the output of the operational amplifier 1. The reference voltage VR is applied to the input A of the corrective switch 27, and the output B of the corrective switch 27 is connected to the input A of the corrective switch 28. The output B of the corrective switch 28 is connected to one end of the resistor 16.

The control inputs C of the corrective switches 25 to 28 are grounded (at the L level), and the power supply voltage is applied to the control inputs D thereof (at the H level). The corrective switches 25 to 28 are constantly set to "ON" under the same conditions as the analog switches 21 to 24 in the ON-state. The other constructions of the amplifier circuit of FIG. 1 are similar to those of the prior art, and the description thereof will be omitted.

The ring modulating circuit, which is the differential amplifier circuit, varies the logical level of the control signal SC at the frequency of a predetermined carrier wave in order to output signal SO, a modulated signal provided by the balanced modulation of the input signal SI.

The amplification operation of the differential amplifier circuit will be discussed below. It is assumed that the reference voltage VR is 0 V. Reference character VI designates the voltage of the input signal SI; VO designates the voltage of the output signal SO; R designates the resistances of the resistors 11 to 16; and r designates the ON-resistances of the analog switches 21 to 24 and corrective switches 25 to 28.

When the control signal SC is at the L level (or ground level), the analog switches 21 and 24 are on and the analog switches 22 and 23 are off. The input signal SI is applied to the negative input of the operational amplifier I through the resistor 11, and the reference voltage VR is applied to the positive input of the operational amplifier I through the resistor 12. As a result, the differential amplifier circuit functions as an inverting amplifier circuit, so that the output voltage VO is determined as:

$$VO = -\{2(R + r)/(R + r)\} \cdot VI \quad (4)$$
$$= -2$$

When the control signal SC is at the H level (power supply voltage level), on the other hand, the analog switches 21 and 24 are off and the analog switches 22 and 23 are on. The input signal SI is applied to the positive input of the operational amplifier 1 through the resistor 12, and the reference voltage VR is applied to the negative input of the operational amplifier 1 through the resistor 11. As a result, the differential amplifier circuit functions as a noninverting amplifier circuit, so that the output voltage VO is determined as:

$$VO = \{(2 + 1)(R + r)/(R + r)\} \cdot \quad (5)$$
$$\{2(R + r)/(2 + 1)(R + r)\} \cdot VI$$
$$= 2 \cdot VI$$

From Formulas (4) and (5), the gain G of the differential amplifier circuit is:

$$G = 2 \quad (6)$$

The gain G is determined independently of the resistances R of the resistors 11 to 16 and the resistances r of the analog switches 21 to 24.

Thus the corrective switches 25 to 28 having the same construction as the analog switches 21 to 24 are provided in series in such numbers that satisfy the desired gain G in the feedback path and reference voltage positive input path, whereby the gain G is provided which does not depend on the ON-resistances of the analog switches 21 to 24.

As a result, the gain G of the differential amplifier circuit is not affected by variation, if any, in the ON-resistances of the analog switches 21 to 24 due to fluctuations in power supply voltage.

Since the differential amplifier circuit of the preferred embodiment is used as the ring modulating circuit, the resistances of the resistors 11 and 12 are set to the same. The resistors 11 and 12 need not have the same resistance when the differential amplifier circuit is used as a normal amplifier circuit.

In the preferred embodiment, the two resistors 13 and 14, each having the same resistance R as the resistor 11, are provided in series in the feedback path and the two resistors 15 and 16, each having the same resistance R as the resistor 12, are provided in series in the reference voltage positive input path, to provide a double resistance. In an alternate embodiment, when the combined resistances satisfy the gain G, a resistor having the resistance 2R, which is twice greater than the resistance of the resistor 11, may be provided in the feedback path, while a resistor having the resistance 2R, which is twice greater than the resistance of the resistor 12, is provided in the reference voltage positive input path.

The combined resistance of the resistors 13 and 14 in the feedback path and the combined resistance of the resistors 15 and 16 in the reference voltage positive input path are twice larger than the resistances of the resistors 11 and 12, respectively, in the preferred embodiment. The present invention, however, is not limited to this. Since the corrective switches 25 to 28 are provided to correct variation in the ON-resistances of the analog switches 21 to 24, it is preferable that the ratio of the combined resistance of the resistors 13 and 14 to the resistance of the resistor 11 and the ratio of the combined resistance of the resistors 15 and 16 to the resistance of the resistor 12 are approximate to a natural number. When the differential amplifier circuit is used as the normal amplifier circuit, the ratio of the resistance in the feedback path to the resistance of the resistor 11 may be different from the ratio of the resistance in the reference voltage positive input path to the resistance of the resistor 12. It is necessary that the number of corrective switches provided in the feedback path is equal to the ratio of the resistance in the feedback path to the resistance of the resistor 11 and that the number of corrective switches provided in the reference voltage positive input path is equal to the ratio of the resistance in the reference voltage positive input path to the resistance of the resistor 12.

The amplifier circuit which has the constructions described below are considered within the scope of the present invention. The resistances corresponding to the resistors 11 and 12 are R1 and R2 (R1≠R2), respectively. The resistance corresponding to the combined resistance of the resistors 13 and 14 is N·R1 (where N is a natural number). The resistance corresponding to the combined resistance of the resistors 15 and 16 is M·R1 (where M is a natural number and M≠N). The number of corrective switches provided in the feedback path is N, and the number of corrective switches provided in the reference voltage positive input path is M. The details of the amplifier circuit having such constructions will be described below.

When the control signal SC is at the L level, the analog switches 21 and 24 are on and the analog switches 22 and 23 are off. The differential amplifier circuit functions as an inverting amplifier circuit, so that the output voltage VO is determined as:

$$VO = -\{N \cdot (R1 + r)/(R1 + r)\} \cdot VI \quad (7)$$
$$= -N \cdot VI$$

When the control signal SC is at the H level, the analog switches 21 and 24 are off and the analog switches 22 and 23 are on. The differential amplifier circuit functions as a noninverting amplifier circuit, so that the output voltage VO is determined as:

$$VO = \{(N + 1)(R1 + r)/(R1 + r)\} \cdot \quad (8)$$
$$\{M(R2 + r)/(M + 1)(R2 + r)\} \cdot VI$$
$$= (N + 1) \cdot M/(M + 1) \cdot VI$$

The gain G of the amplifier circuit, although different between the inverting and noninverting amplifier circuits, is not affected by the ON-resistances r of the analog switches 21 to 24. When the ON-resistances of the analog switches 21 to 24 vary due to fluctuations in power supply voltage, the gain G of the amplifier circuit is not influenced by variation in ON-resistance.

While the invention has been shown and described in detail, the foregoing description is in all aspects illustrative and not restrictive. It is therefore understood that numerous modifications and variations can be devised without departing from the scope of the invention.

What is claimed is:

1. An amplifier circuit comprising:
    a signal input terminal receiving an input signal,
    a control signal input terminal receiving a control signal,
    a reference voltage source for providing a reference voltage of a predetermined level,
    a signal output terminal,
    an operational amplifier having positive and negative inputs and an output connected to said signal output terminal,
    a first resistor portion connected to said negative input of said operational amplifier,
    a second resistor portion connected to said positive input of said operational amplifier,
    a first switch provided between said signal input terminal and said first resistor portion for turning itself on and off as a function of said control signal,
    a second switch provided between said reference voltage source and said first resistor portion for turning itself on and off as a function of said control signal,
    a third switch provided between said signal input terminal and said second resistor portion for turning itself on and off as a function of said control signal,
    a fourth switch provided between said reference voltage source and said second resistor portion for turning itself on and off as a function of said control signal, said first to fourth switches having the same internal construction, said control signal being applied to said first to fourth switches such that the ON/OFF state of said first and fourth switches is constantly opposite to that of said second and third switches,
    a third resistor portion provided in a feedback path from said output of said operational amplifier to said negative input thereof, the resistance ratio of said third resistor portion to said first resistor portion being N where N is a natural number;
    a first corrective switch portion including corrective switches connected in said N-number in series and connected in series with said third resistor portion in said feedback path, said N-number of corrective switches having the same internal construction as said first to fourth switches and being constantly set to an ON-state under the same conditions as said first to fourth switches in the ON-state,
    a fourth resistor portion provided in a reference voltage positive input path from said positive input of said operational amplifier to said reference voltage source, the resistance ratio of said fourth resistor portion to said second resistor portion being M where M is a natural number, and
    a second corrective switch portion including corrective switches connected in said M-number in series and connected in series with said fourth resistor portion in said reference voltage positive input path, said M-number of corrective switches having the same internal construction as said first to fourth switches and being constantly set to the ON-state under the same conditions as said first to fourth switches in the ON-state.

2. The amplifier circuit of claim 1,
    wherein said third resistor portion includes resistors connected in said N-number in series, each of said resistors having the same resistance as said first resistor portion, and
    wherein said fourth resistor portion includes resistors connected in said M-number in series, each of said resistors having the same resistance as said second resistor portion.

3. The amplifier circuit of claim 2, wherein said N and M are equal.

4. The amplifier circuit of claim 3,
    wherein said control signal indicates a logical level of H or L,
    said amplifier circuit further comprising an inverter having an input connected to said control signal input terminal for inverting said logical level of said control signal to output an inverted control signal, and
    wherein each of said first to fourth switches includes a transistor having a first electrode serving as an input, a second electrode serving as an output and a control electrode, said control signal or said inverted control signal being applied to said control electrode of said transistor.

5. The amplifier circuit of claim 4, wherein said transistor is an MOS transistor.

6. The amplifier circuit of claim 5, wherein each of said first to fourth switches includes NMOS and PMOS transistors sharing said first and second electrodes.

7. The amplifier circuit of claim 6,
    wherein said control signal is applied to a gate of said PMOS transistor and said inverted control signal is applied to a gate of said NMOS transistor in said first and fourth switches, and
    wherein said inverted control signal is applied to the gate of said PMOS transistor and said control signal is applied to the gate of said NMOS transistor in said second and third switches.

8. The amplifier circuit of claim 7, wherein an H level logical signal is constantly applied to the gate of the NMOS transistor and an L level logical signal is constantly applied to the gate of the PMOS transistor in each of said corrective switches of said first and second corrective switch portions.

9. A balanced modulating circuit receiving an input signal to be modulated for performing balanced modulation of said input signal under control of a control signal having a logical level varying at a carrier wave frequency to output a modulated signal as an output signal, said balanced modulating circuit comprising:

a signal input terminal receiving said input signal, a control signal input terminal receiving said control signal, a reference voltage source for providing a reference voltage of a predetermined level, a signal output terminal, an operational amplifier having positive and negative inputs and an output connected to said signal output terminal, a first resistor portion connected to said negative input of said operational amplifier, a second resistor portion connected to said positive input of said operational amplifier and having the same resistance as said first resistor portion, a first switch connected in series with said first resistor portion and provided between said signal input terminal and said negative input of said operational amplifier for turning itself on and off as a function of said control signal, a second switch provided between said reference voltage source and said first resistor portion for turning itself on and off as a function of said control signal, a third switch provided between said signal input terminal and said second resistor portion for turning itself on and off as a function of said control signal, a fourth switch provided between said reference voltage source and said second resistor portion for turning itself on and off as a function of said control signal, said first to fourth switches having the same internal construction, said control signal being applied to said first to fourth switches such that the ON/OFF state of said first and fourth switches is constantly opposite to that of said second and third switches, a third resistor portion provided in a feedback path from said output of said operational amplifier to said negative input thereof, the resistance ratio of said third resistor portion to said first resistor portion being N where N is a natural number, a first corrective switch portion including corrective switches connected in said N-number in series and connected in series with said third resistor portion in said feedback path, said N-number of corrective switches having the same internal construction as said first to fourth switches and being constantly set to an ON-state under the same conditions as said first to fourth switches in the ON-state, a fourth resistor portion provided in a reference voltage positive input path from said positive input of said operational amplifier to said reference voltage source, the resistance ratio of said fourth resistor portion to said second resistor portion being N, and a second corrective switch portion including corrective switches connected in said N-number in series and connected in series with said fourth resistor portion in said reference voltage positive input path, said N-number of corrective switches having the same internal construction as said first to fourth switches and being constantly set to the ON-state under the same conditions as said first to fourth switches in the ON-state.

* * * * *